US012642068B2

(12) United States Patent
Cheng et al.

(10) Patent No.: US 12,642,068 B2
(45) Date of Patent: May 26, 2026

(54) MANUFACTURING METHOD FOR FORMING SELF-ALIGNED INTERCONNECTION STRUCTURE

(71) Applicant: Taiwan Semiconductor Manufacturing Company, Ltd., Hsinchu (TW)

(72) Inventors: Kai-Fang Cheng, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 383 days.

(21) Appl. No.: 18/199,568

(22) Filed: May 19, 2023

(65) Prior Publication Data

US 2024/0387250 A1 Nov. 21, 2024

(51) Int. Cl.
*H01L 21/768* (2006.01)
*H01L 21/02* (2006.01)
*H01L 23/532* (2006.01)

(52) U.S. Cl.
CPC .. *H01L 21/76832* (2013.01); *H01L 21/76834* (2013.01); *H01L 23/53295* (2013.01); *H01L 21/02167* (2013.01); *H01L 21/02178* (2013.01); *H01L 21/02274* (2013.01); *H01L 21/02315* (2013.01)

(58) Field of Classification Search
CPC ......... H01L 21/02315; H01L 23/53295; H01L 21/76832; H01L 21/02178; H01L 21/76849; H01L 21/02167; H01L 21/02274; H01L 21/76834
USPC .................................. 257/773; 438/618, 666
See application file for complete search history.

(56) References Cited

U.S. PATENT DOCUMENTS

| | | | | |
|---|---|---|---|---|
| 2008/0197500 A1* | 8/2008 | Yang | ................. | H01L 23/53223 257/E23.141 |
| 2008/0286966 A1* | 11/2008 | Hohage | ............. | H01L 21/76883 438/653 |
| 2018/0096886 A1* | 4/2018 | Reddy | ................... | H01L 21/022 |
| 2022/0157710 A1* | 5/2022 | Li | ........................ | H01L 23/5283 |
| 2022/0285210 A1* | 9/2022 | Lin | .................... | H01L 21/76813 |
| 2022/0359411 A1* | 11/2022 | Ho | .................... | H01L 23/53295 |

* cited by examiner

*Primary Examiner* — Didarul A Mazumder
(74) *Attorney, Agent, or Firm* — Birch, Stewart, Kolasch & Birch, LLP

(57) ABSTRACT

A self-aligned interconnection structure includes a dielectric layer, a conductive feature, a capping layer, a first barrier layer and a second barrier layer. The conductive feature is formed in the dielectric layer, and the conductive feature has a top surface. The capping layer is disposed on the top surface of the conductive feature, and the capping layer does not cover the dielectric layer. The first barrier layer is disposed on the capping layer, and the first barrier layer does not cover the dielectric layer. The second barrier layer covers the first barrier layer and the dielectric layer, and the first barrier layer and the second barrier layer are formed of different materials.

16 Claims, 7 Drawing Sheets

100

101

101

101

MANUFACTURING METHOD FOR FORMING SELF-ALIGNED INTERCONNECTION STRUCTURE

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

For manufacturing different conductive layers on the substrate, the self-aligned contact (SAC) process may be utilized to avoid misalignment. However, the integrated fabrication also brings out some issues, such as reliability, high capacitance, or high resistance. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
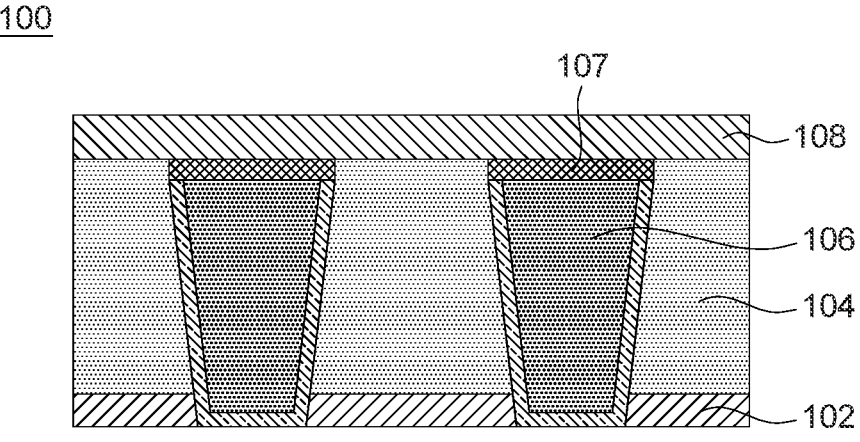
FIG. 1 is a schematic diagram of an interconnection structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a schematic diagram of an interconnection structure 100. The interconnection structure 100 may be formed on various devices of a semiconductor structure. For example, the interconnection structure 100 may be formed over one or more devices, such as transistors, diodes, image sensors, resistors, capacitors, inductors, memory cells, the above combinations, and/or other suitable devices. In some embodiments, the interconnection structure 100 may be formed over a transistor, such as a nanostructure field effect transistor having a plurality of channels surrounded by a gate electrode layer.

Referring to FIG. 1, the interconnection structure 100 includes an etch stop layer 102, a dielectric layer 104, a conductive feature 106, a capping layer 107 and a barrier layer 108. The dielectric layer 104 can be formed by chemical vapor deposition (CVD), atomic layer deposition (ALD), spin coating or other suitable processes. Conductive feature 106 may comprise an electrically conductive material such as copper, cobalt, ruthenium, molybdenum, chromium, tungsten, manganese, rhodium, iridium, nickel, palladium, platinum, silver, gold, aluminum, a combination thereof, or other suitable materials. Conductive feature 106 and capping layer 107 each include a metal. The conductive feature 106 can be formed by a physical vapor deposition (PVD), a chemical vapor deposition, an atomic layer deposition, or other suitable processes. The conductive feature 106 can be electrically connected to a conductive contact (e.g., a source region or a drain region) under the interconnection structure 100. The barrier layer 108 is formed entirely on the dielectric layer 104, and the barrier layer 108 can serve as an etching stop layer (ESL). The barrier layer 108 may include silicon-containing materials (for example: silicon oxycarbide, silicon carbonitride, silicon nitride, silicon oxycarbonitride, silicon oxide, silicon carbide, silicon oxynitride, etc. The barrier layer 108 may be formed by physical vapor deposition, chemical vapor deposition, atomic layer deposition, spin coating or any suitable deposition process. The thickness of the barrier layer 108 can be in the range of about 10 angstroms to about 100 angstroms. Since the barrier layer 108 is formed comprehensively on the dielectric layer 104 and has a material with a high dielectric constant, so that the interconnection structure 100 has a high capacitance characteristic.

Figure 2A:
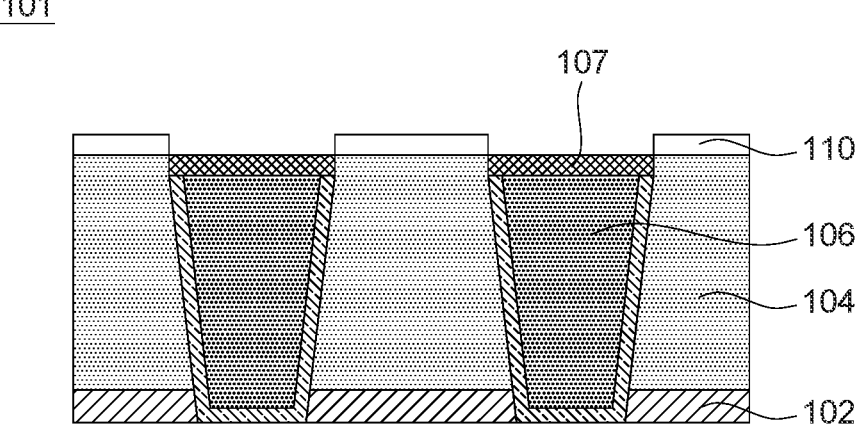
FIGS. 2A to 2C are schematic diagrams of a method for manufacturing an interconnection structure.
Figure 2B:
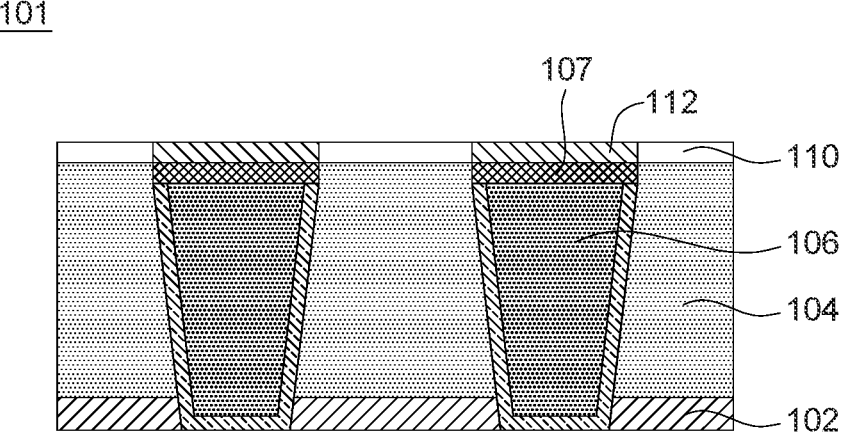
Figure 2C:
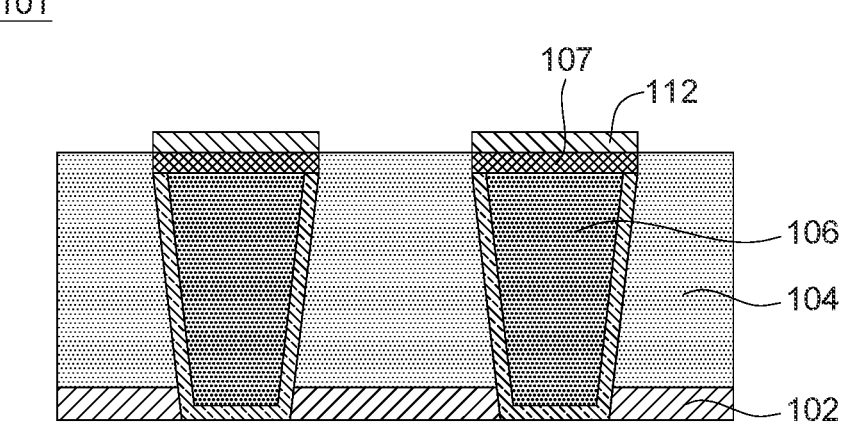

Referring to FIGS. 2A to 2C, FIGS. 2A to 2C are schematic diagrams illustrating a method for manufacturing an interconnection structure 101. The interconnection structure 101 utilizes a self-aligned patterning process to form a barrier layer on the conductive feature 106. Referring to FIGS. 2A and 2B, the interconnection structure 101 includes an etch stop layer 102, a dielectric layer 104, a conductive feature 106, a capping layer 107, a self-assembled mono-layer (SAM) 110 and a barrier layer 112. The dielectric layer 104, the conductive feature portion 106 and the capping layer 107 are formed in the same manner as above, and will not be repeated here. The self-assembled monolayer 110 is formed only on the dielectric layer 104 and not on the conductive feature 106. The self-assembled monolayer 110 can be formed on the dielectric layer 104 by an oxide inhibition process. In some embodiments, a silane-based self-assembled monolayer 110 is used as an inhibitor in the oxide inhibition process. The self-assembled monolayer 110 can be formed by chemical vapor deposition, molecular layer deposition (MLD) or other suitable processes. As shown in FIG. 2B, after forming the self-assembled mono-layer 110, a barrier layer 112 is selectively formed on the conductive features 106. Before forming the self-assembled monolayer 110, in order to make the self-assembled mono-layer 110 and the barrier layer 112 have better selectivity, a pre-treatment process can be performed on the top surface of the dielectric layer 104 and the conductive feature 106, to clean the reactive surface. In FIG. 2C, the self-assembled monolayer 110 can be removed by a dry etching process, a wet etching process, or other suitable processes.

The barrier layer 112 can be used as an etch stop layer (ESL), and the barrier layer 112 can include silicon-con-taining materials (for example: silicon oxycarbide, silicon carbonitride, silicon nitride, silicon oxycarbonitride, silicon oxide, carbon silicon, silicon oxynitride, etc. The barrier layer 112 can be formed by physical vapor deposition, chemical vapor deposition, atomic layer deposition, spin coating or any suitable deposition process. The thickness of the barrier layer 112 can be in the range between about 10 angstroms and about 100 angstroms. Since the barrier layer 112 is only formed on the conductive feature 106, compared to the barrier layer 108 formed on the dielectric layer 104 comprehensively, the capacitance of the interconnection structure 101 can be reduced. However, using the self-assembled monolayer 110 to form the self-aligned intercon-nection structure 101 may occur that the self-assembled monolayer 110 residue remains on the metal line and/or undesirable reactions between the self-assembled monolayer 110 and the subsequent deposition of the precursor (for example, forming an etch stop layer).

Figure 3A:
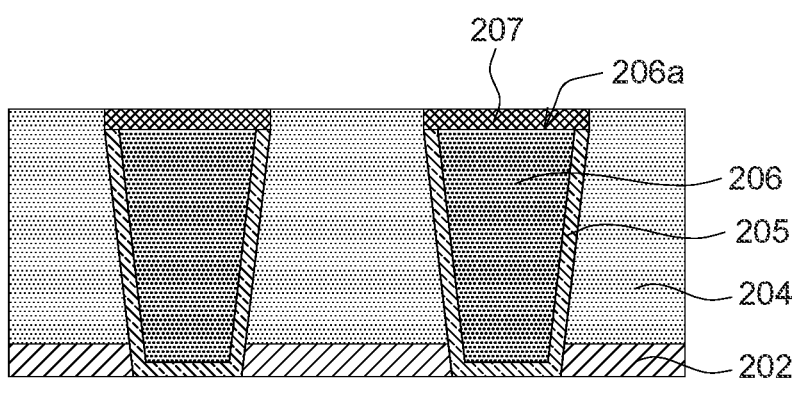
FIGS. 3A to 3C are schematic diagrams illustrating a method for manufacturing a self-aligned interconnection structure according to an embodiment of the present disclosure.
Figure 3B:
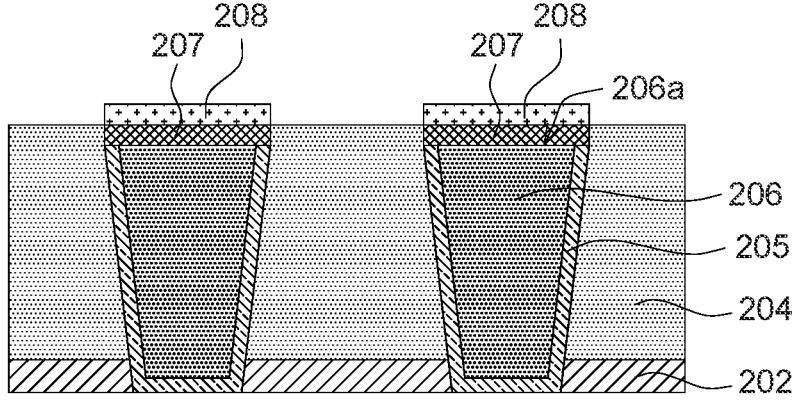
Figure 3C:
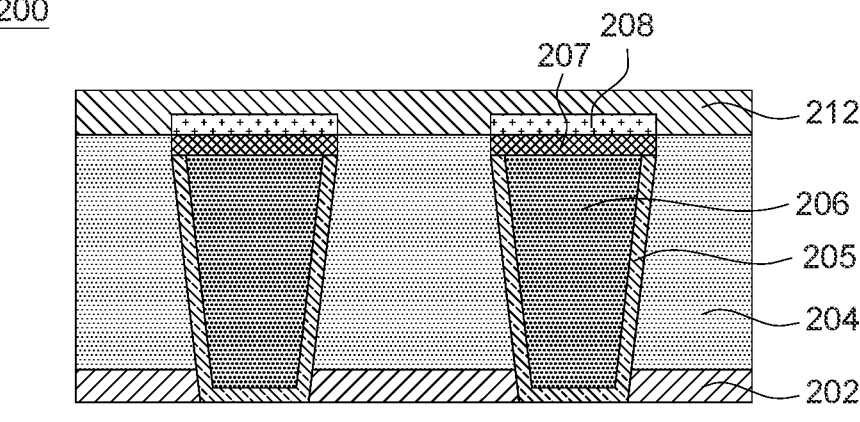

Referring to FIGS. 3A to 3C, FIGS. 3A to 3C are schematic diagrams illustrating a method for manufacturing a self-aligned interconnection structure 200 according to an embodiment of the present disclosure. The self-aligned interconnection structure 200 includes an etch stop layer 202, a dielectric layer 204, a conductive feature 206, a capping layer 207, a first barrier layer 208 and a second barrier layer 212. As shown in FIG. 3A, a conductive feature 206 is formed in the dielectric layer 204, and the conductive feature 206 has a top surface 206a. The capping layer 207 is disposed on the top surface 206a of the conductive feature 206, and the capping layer 207 does not cover the dielectric layer 204. As shown in FIG. 3B, the first barrier layer 208 is disposed on the capping layer 207, and the first barrier layer 208 does not cover the dielectric layer 204. As shown in FIG. 3C, the second barrier layer 212 completely covers the first barrier layer 208 and the dielectric layer 204, and the first barrier layer 208 and the second barrier layer 212 are formed of different materials.

In some implementations, the interconnection structure 200 may be formed on, over and/or under the semiconductor device structure. One or more etch stop layers (ESL) 202 may be formed under the dielectric layer 204. An etch stop layer (ESL) 202 may be used to control the etch depth of the dielectric layer 204 when forming conductive features 206 within the dielectric layer 204. In some embodiments, the etch stop layer (ESL) 202 may include $SiN_x$, $SiC_xN_y$, $SiO_xC_y$, $SiC_x$, or other suitable materials. In some embodi-ments, the etch stop layer (ESL) 202 can be deposited at a temperature between 450 degrees Celsius and 300 degrees Celsius by chemical vapor deposition (CVD), physical vapor deposition (PVD), atomic layer deposition (ALD), spin coating or other suitable process.

In some embodiments, the dielectric layer 204 can be made of amorphous $SiO_x$, $SiO_xC_yH_z$, $SiO_xC_y$, $SiC_x$ or related low-k materials, and the range of k value can be between 2.0 and 3.0 or between 2.5 and 3.5. The dielectric layer 204 may be made of $SiO_x$, $SiO_xC_yH_z$, $SiO_xC_y$, $SiC_x$ or related low-k materials with ordered pores or non-porosity. As used herein, the term "ordered pores" refers to voids or air gaps formed in a dielectric material in a predetermined arrangement and filled with air. The dielectric layer 204 with ordered pores has the characteristics of low dielectric constant and high mechanical strength. In some embodiments, the first dielectric layer 204 can be deposited at a temperature between 450 degrees Celsius and 300 degrees Celsius by chemical vapor deposition (CVD), physi-cal vapor deposition (PVD), atomic layer deposition (ALD), spin coating or other suitable process. In some embodi-ments, additional annealing or ultraviolet (UV) curing pro-cesses may be performed in the fabrication of the dielectric layer 204 or may not be used.

In some embodiments, the conductive feature 206 may include Cu, Ni, Co, Ru, Ir, Al, Pt, Pd, Au, Ag, Os, W, Mo, and related alloys. The conductive feature 206 can be formed by atomic layer deposition (ALD), chemical vapor deposition (CVD), physical vapor deposition (PVD), elec-troless deposition (ELD), electrochemical plating (ECP) at a temperature between 450 degrees Celsius and 300 degrees Celsius or other suitable process.

In some embodiments, a barrier layer 205 can be formed between the dielectric layer 204 and the conductive feature 206. In some embodiments, the conductive feature 206 can be formed in the dielectric layer 204 by dual damascene, single damascene, half damascene or other suitable process. Taking the single damascene process as an example, an etch stop layer (ESL) 202 and a dielectric layer 204 are sequen-tially deposited, and the dielectric layer 204 is etched to form openings according to a predefined pattern. Then, the barrier layer 205 is deposited in the opening, and a conduc-tive material (e.g., copper) is deposited on the barrier layer 205. The conductive material is deposited on the barrier layer 205 in the opening. A seed layer can be formed on the barrier layer 205 through a physical vapor deposition (PVD) process, and then a conductive material can be formed on the seed layer through an electrodeposition process. Afterwards, the top surface of the conductive material is planarized so that the top surfaces of the conductive feature 206, the barrier layer 205 and the dielectric layer 204 are substan-tially coplanar.

As shown in FIG. 3A, a capping layer 207 is formed on the top surface 206a of the conductive feature 206. In some embodiments, the capping layer 207 may include silicon oxycarbide, silicon carbonitride, silicon nitride, silicon oxy-carbonitride, silicon oxide, silicon carbide, silicon oxyni-tride or other suitable dielectric materials. In some embodiments, the capping layer 207 can be formed by chemical vapor deposition (CVD), physical vapor deposition (PVD), atomic layer deposition (ALD) or other suitable processes at a temperature of 450° C. to 150° C. The capping layer 207 can prevent the conductive feature 206 from causing metal diffusion to the subsequently formed dielectric material.

As shown in FIG. 3B, the first barrier layer 208 is formed on the capping layer 207, and the first barrier layer 208 does not cover the dielectric layer 204. The first barrier layer 208 can be formed by chemical vapor deposition (CVD), physical vapor deposition (PVD), atomic layer deposition (ALD) or other suitable processes at a temperature between 450 degrees Celsius and 300 degrees Celsius. In some embodiments, before forming the first barrier layer 208 on the capping layer 207, a pre-treatment process may be performed to help selectively deposit the first barrier layer 208 on the capping layer 207. The pre-treatment process may be performed by exposing the interconnection structure 200 to $H_2$ plasma formed from a hydrogen-containing precursor (e.g., hydrogen, ammonia, hydrocarbons, or the like, or any combination thereof) to achieve self-aligned interconnection. Plasma treatment can increase the selectivity of selective deposition for self-aligned patterning process.

For example, $H_2$ plasma can change the surface function of the dielectric layer 204 by reducing the number of unwanted hydroxyl groups on the surface of the carbon-containing layer and providing a strong chemical modification of the carbon-containing layer through surface hydrogenation. The treated surface of the carbon-containing layer retards nucleation of the first barrier layer 208. For example, during the deposition of the first barrier layer 208, the first barrier layer 208 is selectively formed on the capping layer 207 by using trimethylaluminum (TMA) combined with $H_2$ plasma (NH3), instead of bonded to the treated surface of the amorphous carbon-containing layer. Therefore, the pre-treatment process can help to selectively deposit the first barrier layer 208 on the capping layer 207.

In some embodiments, the first barrier layer 208 may include AlNx, AlOx, AlOxNy or other suitable materials. The k value of the first barrier layer 208 may range from about 7.0 to about 9.0. The thickness of the first barrier layer 208 may range from about 10 angstroms to about 30 angstroms. In some embodiments, the first barrier layer 208 can be deposited by chemical vapor deposition (CVD), physical vapor deposition (PVD), atomic layer deposition (ALD), spin coating or other suitable process at a temperature between 400 degrees Celsius and 300 degrees Celsius. The first barrier layer 208 may be formed by performing a pre-treatment process through $NH_3$ plasma and ultraviolet light (UV) irradiation, and then through TMA (trimethylaluminum) and $NH_3$ plasma conversion through ultraviolet light (UV) irradiation.

As shown in FIG. 3C, the second barrier layer 212 is formed on the first barrier layer 208 and the dielectric layer 204, and the first barrier layer 208 and the second barrier layer 212 are formed of different materials. In some embodiments, the second barrier layer 212 may include silicon-containing materials (for example: silicon oxycarbide (SiCO), silicon carbonitride (SiCN), silicon nitride (SiNx), silicon oxycarbonitride, silicon oxide (SiOx), silicon carbide (SiCx), silicon oxynitride, etc.). The second barrier layer 212 can be formed by chemical vapor deposition (CVD), physical vapor deposition (PVD), atomic layer deposition (ALD), spin coating or other suitable process at a temperature between 450° C. and 300° C. The k value of the second barrier layer 212 may range from 4.2 to 4.5, and the thickness of the second barrier layer 212 may range from about 10 angstroms to about 100 angstroms.

Through the interconnection structure formed by the above operation steps, a self-aligned interconnection structure 200 can be formed without using a self-assembled monolayer (SAM) 110. The self-assembled monolayer (SAM) 110 is used to prevent accumulation of conductive material outside the metal interconnection area. However, using a self-assembled monolayer (SAM) 110 process to form the self-aligned interconnection structure, it may occur that SAM 110 residues remain on the metal lines and/or unwanted reactions between the self-assembled monolayer (SAM) 110 and subsequent deposition precursors (e.g., precursors for forming etch stop layer). By selectively forming the first barrier layer 208 on the conductive feature 206 through the above operation steps without using the self-assembled monolayer (SAM) 110 for the patterning process, problems with forming self-aligned interconnection structures by use of the self-assembled monolayer (SAM) 110 can be avoided. Therefore, the reliability of the self-aligned interconnection structure 200 can be improved, and the resistance and capacitance of the self-aligned interconnection structure 200 can be reduced.

In some embodiments, the dielectric layer 204 may include a dielectric material with ordered pores or be made of other materials, and the materials with ordered pores have characteristics of low dielectric constant and high mechanical strength. Therefore, the k value of the dielectric layer 204 can be reduced, and the capacitance of the self-aligned interconnection structure 200 can also be reduced. In case of misalignment, it is advantageous to use a dielectric material with ordered porosity. In addition, since the barrier layer 108 as an etch stop layer (ESL) has a high dielectric constant, the self-aligned interconnection structure 200 can reduce capacitance without the etch stop layer (ESL) 108.

In some embodiments, the first barrier layer 208 and the second barrier layer 212 can be used as an etch stop layer or other purposes. A second dielectric layer (not shown) can be formed on the first dielectric layer (i.e., the dielectric layer 204) by chemical vapor deposition (CVD), physical vapor deposition (PVD), atomic layer deposition (ALD) and another conductive feature (not shown) can be formed in the second dielectric layer, the first barrier layer 208 and the second barrier layer 212 can control the etching depth of the second dielectric layer.

In some embodiments, the first barrier layer 208 can be used as an adhesive layer to increase the adhesion between the second barrier layer 212 and the conductive feature 206. In addition, the first barrier layer 208 can prevent voids in the metal gap and reduce the resistance of the interconnection window.

In some embodiments, the first barrier layer 208 can be used as an anti-oxidation layer for the conductive feature 206. When the second barrier layer 212 (such as SiCO, SiOxCy or other materials) is formed by chemical vapor deposition (CVD), physical vapor deposition (PVD), atomic layer deposition (ALD) or when the second dielectric layer is formed on the first dielectric layer (i.e., 204), the first barrier layer 208 can prevent the conductive feature 206 from being oxidized. In some embodiments, when the conductive feature 206 is formed of a highly diffusive material (e.g., Cu), a capping layer 207 and a first barrier layer 208 may be required to prevent metal diffusion, as shown in FIG. 3B. However, in some embodiments, when the conductive feature 206 is formed of a low-diffusion material (e.g., Ru), the capping layer 207 forming on the conductive feature 206 is sufficient to prevent metal diffusion, and at this time, the first barrier layer 208 can serve as an anti-oxidation layer to prevent the conductive feature 206 from being oxidized, and the second barrier layer 212 can be used as a hermetic layer to prevent water and oxygen from penetrating.

Figure 4A:
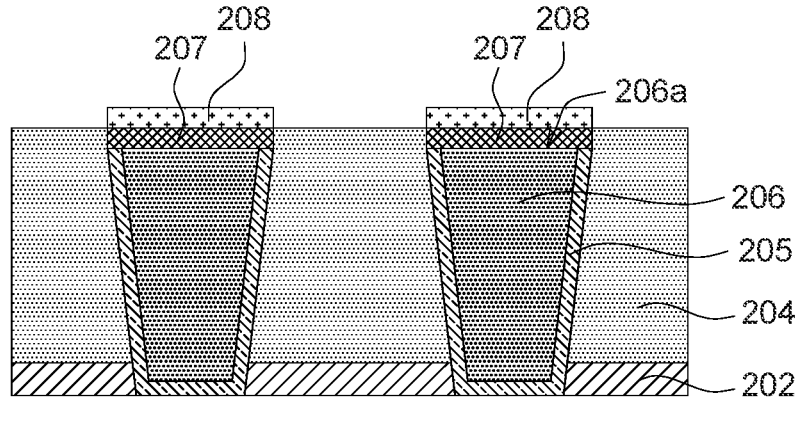
FIGS. 4A to 4B are schematic diagrams illustrating a method for manufacturing a self-aligned interconnection structure according to another embodiment of the present disclosure.
Figure 4B:
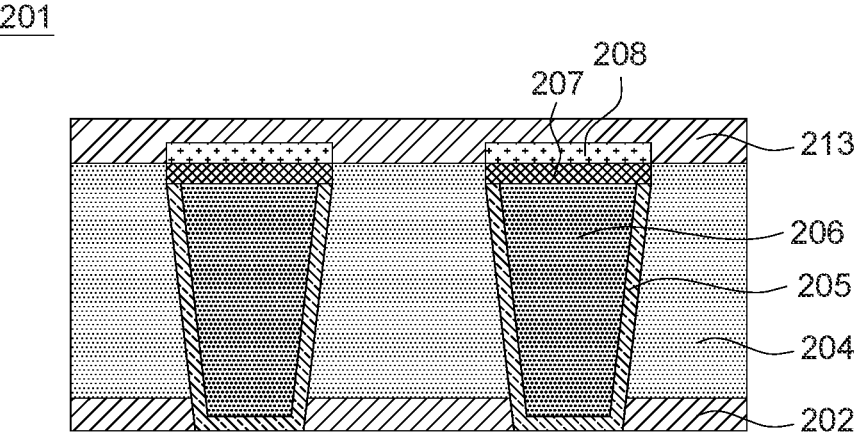

Referring to FIGS. 4A to 4B, FIGS. 4A to 4B are schematic diagrams illustrating a method of manufacturing a self-aligned interconnection structure 201 according to an embodiment of the present disclosure. The self-aligned interconnection structure 201 includes an etch stop layer 202, a dielectric layer 204, a conductive feature 206, a capping layer 207, a first barrier layer 208 and a second barrier layer 213. As shown in FIG. 4A, a conductive feature 206 is formed in the dielectric layer 204, and the conductive feature 206 has a top surface 206a. The capping layer 207 is disposed on the top surface 206a of the conductive feature 206, and the capping layer 207 does not cover the dielectric layer 204. In addition, the first barrier layer 208 is disposed on the capping layer 207, and the first barrier layer 208 does not cover the dielectric layer 204. As shown in FIG. 4B, the second barrier layer 213 completely covers the first barrier layer 208 and the dielectric layer 204, and the first barrier layer 208 and the second barrier layer 213 are formed of different materials.

The fabrication methods and materials of the dielectric layer 204, the conductive feature 206, the capping layer 207, the first barrier layer 208, and the second barrier layer 213 (such as the second barrier layer 212) are as described above, and will not be described here. In some embodiments, before forming the first barrier layer 208 on the capping layer 207, a pre-treatment process may be performed to help selectively deposit the first barrier layer 208 on the capping layer 207.

In some embodiments, the second barrier layers 212, 213 may include a silicon-containing material (such as silicon carbonitride (SiCN), silicon oxycarbide (SiCO) or other suitable materials), and the second barrier layer 213 may serve as a hermetic layer to prevent water and oxygen from penetrating. The first barrier layer 208 can be used as an adhesive layer to increase the adhesion between the second barrier layers 212, 213 and the conductive feature 206. The second barrier layers 212, 213 can be formed by reacting a silicon-containing precursor with $NH_3$ plasma to produce a nitrogen-doped silicon carbide (SiCN) film, or by reacting a silicon-containing precursor with $CO_2$ or $O_2$ plasma to produce oxygen-doped silicon carbide (SiCO) film. The k value of the second barrier layers 212, 213 may range from 4.2 to 4.5 or higher.

In some embodiments, the concentration of carbon, oxygen, and/or nitrogen in the second barrier layers 212, 213 may be largely related to the molecular weight of the precursor. Alternatively, another method to control the composition of the second barrier layers 212, 213 is to change the flow rate of the precursor and/or change the species of the reactive gas to control the composition of the silicon carbide film. For example, tetramethylsilane (4 MS) can be flowed in to react with $NH_3$ or $CO_2$ to form SiCN or SiCO, respectively. The flow rate of tetramethylsilane (4 MS) can be relatively low, while the flow rate of $NH_3$ or $CO_2$ can be relatively high to form SiCN or SiCO, where the carbon content is low.

In some embodiments, each of the second barrier layers 212, 213 is a low dielectric constant silicon carbide film (such as SiCN or SiCO). To adjust the dielectric constant of the second barrier layer 212, 213, the effective dielectric constant can be adjusted by selecting an appropriate precursor to produce a specific C:N or C:O ratio. In some embodiments, the dielectric constant of the second barrier layers 212, 213 may be between about 3.0 and about 4.2 or between about 4.2 and about 4.5.

In some embodiments, the second barrier layers 212, 213 may serve as a hermetic layer or a diffusion barrier layer. When the density of the second barrier layers 212, 213 increases, the hermeticity and diffusion barrier properties of the second barrier layers 212, 213 will be improved. Increases in density can be achieved by increasing the amount of crosslinks. The increase in cross-linking improves the hermeticity and diffusion barrier properties of the second barrier layers 212, 213 by introducing a small amount of oxygen and/or nitrogen into the silicon carbide film. Therefore, a precursor with a relatively high C:N or C:O ratio can enhance the hermeticity and diffusion barrier properties of the second barrier layers 212, 213.

Figure 5A:
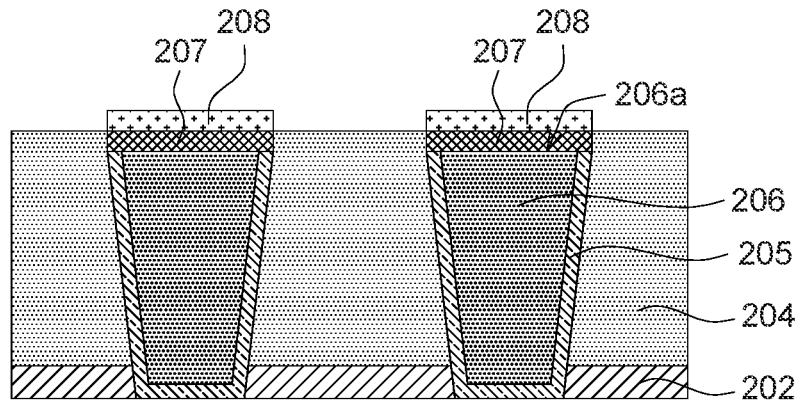
FIGS. 5A to 5B are schematic diagrams illustrating a method for manufacturing a self-aligned interconnection structure according to another embodiment of the present disclosure.
Figure 5B:
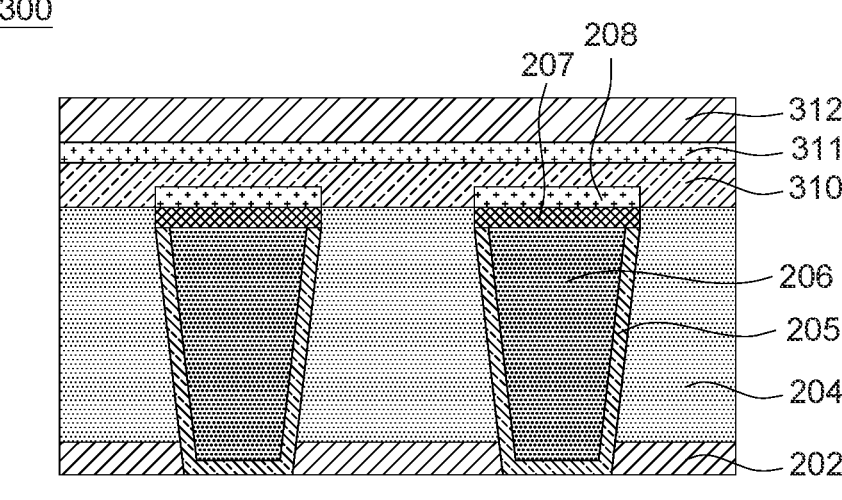

Referring to FIGS. 5A to 5B, FIGS. 5A to 5B are schematic diagrams illustrating a method of manufacturing a self-aligned interconnection structure 300 according to an embodiment of the present disclosure. The self-aligned interconnection structure 300 includes an etch stop layer 202, a dielectric layer 204, a conductive feature 206, a capping layer 207, a first barrier layer 208, a second barrier layer 310, a third barrier layer 311 and a fourth barrier layer 312. As shown in FIG. 5A, a conductive feature 206 is formed in the dielectric layer 204, and the conductive feature 206 has a top surface 206a. The capping layer 207 is disposed on the top surface 206a of the conductive feature 206, and the capping layer 207 does not cover the dielectric layer 204. In addition, the first barrier layer 208 is disposed on the capping layer 207, and the first barrier layer 208 does not cover the dielectric layer 204. As shown in FIG. 5B, the second barrier layer 310 completely covers the first barrier layer 208 and the dielectric layer 204, the third barrier layer 311 completely covers the second barrier layer 310, and the fourth barrier layer 312 completely covers the third barrier layer 311. The first barrier layer 208 and the second barrier layer 310 are formed of different materials, and the third barrier layer 311 and the fourth barrier layer 312 are formed of different materials.

In some embodiments, the first barrier layer 208 and the third barrier layer 311 may be formed of the same material, and the second barrier layer 310 and the fourth barrier layer 312 may be formed of the same material. The first barrier layer 208 and the third barrier layer 311 may include AlNx, AlOx, AlOxNy or other suitable materials. The second barrier layer 310 and the fourth barrier layer 312 may include silicon-containing materials (such as SiCN, SiCO or other suitable materials).

The fabrication methods and materials of the dielectric layer 204, the conductive feature 206, the capping layer 207, the first barrier layer 208, and the second barrier layer 310 (such as the second barrier layer 212) are described as above, and will not be described here. The third barrier layer 311 and the fourth barrier layer 312 can be formed by chemical vapor deposition (CVD), physical vapor deposition (PVD), atomic layer deposition (ALD), spin coating or other suitable process at a temperature between 450 degrees Celsius and 300 degrees Celsius. In some embodiments, before forming the first barrier layer 208 on the capping layer 207, a pre-treatment process may be performed to help selectively deposit the first barrier layer 208 on the capping layer 207. The first barrier layer 208 may include AlNx, AlOx, AlOxNy or other suitable materials.

In some embodiments, the fourth barrier layer 312 may include a silicon-containing material (such as silicon carbonitride (SiCN), silicon oxycarbide (SiCO) or other suitable materials), and the fourth barrier layer 312 may serve as a hermetic layer for preventing the penetration of water and oxygen. The third barrier layer 311 can serve as an adhesive layer to increase the adhesion between the fourth barrier layer 312 and the second barrier layer 310. The fourth barrier layer 312 can be formed by reacting a silicon-containing precursor with $NH_3$ plasma to produce a nitrogen-doped silicon carbide (SiCN) film, or by reacting a silicon-containing precursor with $CO_2$ or $O_2$ plasma to produce an oxygen-doped Silicon carbide (SiCO) film. The k value of the fourth barrier layer 312 may range from 4.2 to 4.5.

In some embodiments, the concentration of carbon, oxygen, and/or nitrogen in the fourth barrier layer 312 may be largely related to the molecular weight of the precursor. Alternatively, another way to control the composition of the fourth barrier layer 312 is to change the flow rate of the precursor and/or change the species of the reactive gas to control the composition of the silicon carbide film. For example, tetramethylsilane (4 MS) can be flowed in to react with $NH_3$ or $CO_2$ to form silicon carbides (such as SiCN or SiCO), respectively. The flow rate of tetramethylsilane (4 MS) can be relatively low, while the flow rate of $NH_3$ or $CO_2$ can be relatively high to form silicon carbides (such as SiCN or SiCO), where the carbon content is low.

In some embodiments, the fourth barrier layer 312 may serve as a hermetic layer or a diffusion barrier layer. When the density of the fourth barrier layer 312 increases, the hermeticity and diffusion barrier properties of the fourth barrier layer 312 will be improved. Increases in density can be achieved by increasing the amount of crosslinks. The increased crosslinking improves the hermeticity and diffusion barrier properties of the fourth barrier layer 312 by introducing a small amount of oxygen and/or nitrogen into the silicon carbide film. Therefore, the precursor with a relatively high C:N or C:O ratio can improve the hermeticity and diffusion barrier properties of the fourth barrier layer 312.

In some embodiments, the second barrier layer 310 is made of silicon carbide (such as SiCN or SiCO) of a low dielectric constant. To adjust the dielectric constant of the second barrier layer 310, the effective dielectric constant can be adjusted by selecting an appropriate precursor to produce a specific C:N or C:O ratio. In some embodiments, the dielectric constant of the second barrier layer 310 may be between about 3.0 and about 4.2, and the dielectric constant of the second barrier layer 310 may be less than that of the fourth barrier layer 312.

Figure 6A:
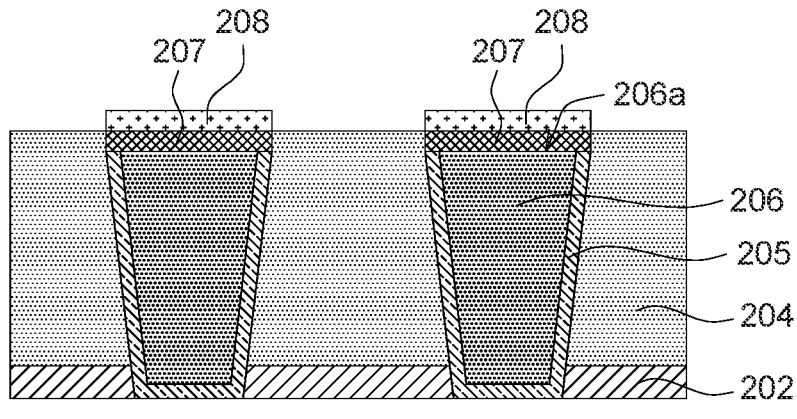
FIGS. 6A to 6B are schematic diagrams illustrating a method for manufacturing a self-aligned interconnection structure according to another embodiment of the present disclosure.
Figure 6B:
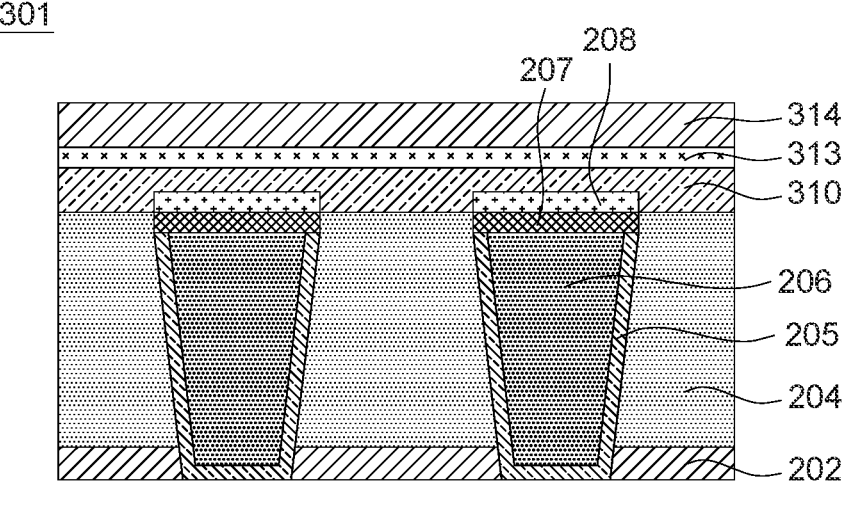

Referring to FIGS. 6A to 6B, FIGS. 6A to 6B are schematic diagrams illustrating a method of manufacturing a self-aligned interconnection structure 301 according to an embodiment of the present disclosure. The self-aligned interconnection structure 301 includes an etch stop layer 202, a dielectric layer 204, a conductive feature 206, a capping layer 207, a first barrier layer 208, a second barrier layer 310, a third barrier layer 313 and a fourth barrier layer 314. The structure and manufacturing method of the first barrier layer 208, the second barrier layer 310, the third barrier layer 313 and the fourth barrier layer 314 in this embodiment are similar to the interconnection structure and the manufacturing method thereof shown in FIGS. 5A and 5B, the difference lies in the different materials.

In some embodiments, the first barrier layer 208 and the third barrier layer 313 may be formed of different materials, and the second barrier layer 310 and the fourth barrier layer 314 may be formed of different materials. In FIG. 6B, the first barrier layer 208 may include AlNx, AlOx, AlOxNy or other suitable materials, the third barrier layer 313 may include silicon-containing material (such as SiNx or other suitable materials), the second barrier layer 310 and the fourth barrier layer 314 may include silicon-containing material (such as SiCN, SiCO or other suitable materials).

Figure 7A:
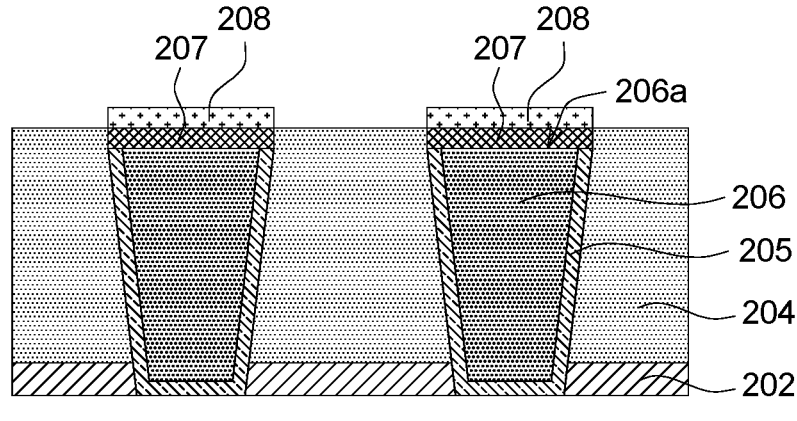
FIGS. 7A to 7B are schematic diagrams illustrating a method for manufacturing a self-aligned interconnection structure according to another embodiment of the present disclosure.
Figure 7B:
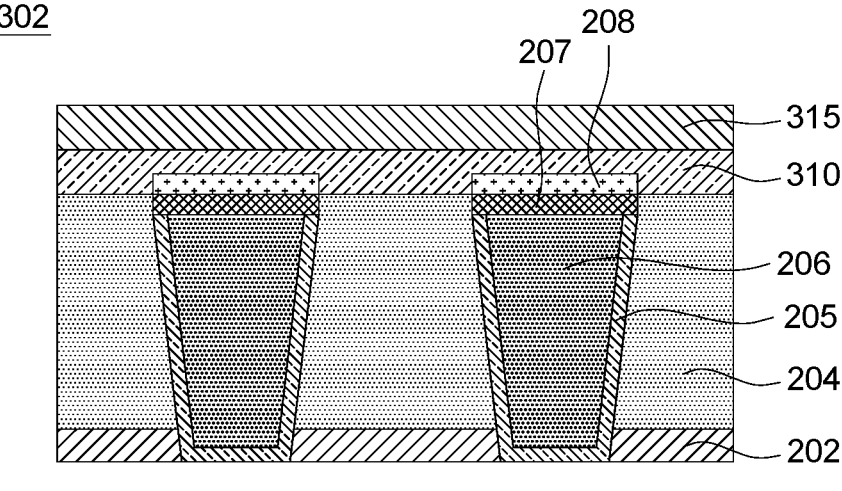

Referring to FIGS. 7A to 7B, FIGS. 7A to 7B are schematic diagrams illustrating a method of manufacturing the self-aligned interconnection structure 302 according to an embodiment of the present disclosure. The self-aligned interconnection structure 302 includes an etch stop layer 202, a dielectric layer 204, a conductive feature 206, a capping layer 207, a first barrier layer 208, a second barrier layer 310 and a third barrier layer 315. As shown in FIG. 7A, a conductive feature 206 is formed in the dielectric layer 204, and the conductive feature 206 has a top surface 206a. The capping layer 207 is disposed on the top surface 206a of the conductive feature 206, and the capping layer 207 does not cover the dielectric layer 204. In addition, the first barrier layer 208 is disposed on the capping layer 207, and the first barrier layer 208 does not cover the dielectric layer 204. As shown in FIG. 7B, the second barrier layer 310 completely covers the first barrier layer 208 and the dielectric layer 204, the third barrier layer 315 completely covers the second barrier layer 212, and the first barrier layer 208, the second barrier layer 310 and the third barrier layer 315 are formed of different materials.

The manufacturing method and materials of the dielectric layer 204, the conductive feature 206, the capping layer 207, the first barrier layer 208, the second barrier layer 310 (such as the second barrier layers 212, 213) and the third barrier layer 315 are described as above, and will not be described here. In some embodiments, before forming the first barrier layer 208 on the capping layer 207, a pre-treatment process may be performed to help selectively deposit the first barrier layer 208 on the capping layer 207. The first barrier layer 208 may include AlNx, AlOx, AlOxNy or other suitable materials.

In some embodiments, the second barrier layer 310 and the third barrier layer 315 may include silicon-containing materials (such as silicon carbonitride (SiCN), silicon oxycarbide (SiCO) or other suitable materials), the third barrier layer 315 can serve as a hermetic layer to prevent the infiltration of water and oxygen. The third barrier layer 315 can be formed by reacting a silicon-containing precursor with $NH_3$ plasma to produce a nitrogen-doped silicon carbide (SiCN) film, or by reacting a silicon-containing precursor with $CO_2$ or $O_2$ plasma to produce oxygen-doped silicon carbide (SiCO) films. The k value of the third barrier layer 315 may range from 4.2 to 4.5 or higher.

In some embodiments, the second barrier layer 310 is made of silicon carbide film (such as SiCN or SiCO) of a low dielectric constant. To adjust the dielectric constant of the second barrier layer 310, the effective dielectric constant can be adjusted by selecting an appropriate precursor to produce a specific C:N or C:O ratio. In some embodiments, the dielectric constant of the second barrier layer 310 may be between about 3.0 and about 4.2.

In some embodiments, the third barrier layer 315 may serve as a hermetic layer or a diffusion barrier layer. When the density of the third barrier layer 315 increases, the hermeticity and diffusion barrier properties of the third barrier layer 315 will be improved. Increases in density can be achieved by increasing the amount of crosslinks. The increased crosslinking improves the hermeticity and diffusion barrier properties of the third barrier layer 315 by introducing a small amount of oxygen and/or nitrogen into the silicon carbide film. Therefore, the precursor with a relatively high C:N or C:O ratio can improve the hermeticity and diffusion barrier properties of the third barrier layer 315.

In some embodiments, a double-stacked or triple-stacked barrier layer can be placed between the two dielectric layers adjacent to each other, and can be used as an etch stop layer or a diffusion barrier layer for conductive feature 206 (e.g., copper). In addition, the presence of a silicon carbide film doped with oxygen or nitrogen (such as the second barrier layer or the third barrier layer) can provide a sufficiently low dielectric constant and superior characteristics to serve as an anti-oxidation layer for the conductive feature 206 (such as copper). For example: in FIG. 4B, a double-layer barrier is composed of SiCN/AlN, in FIG. 3C, a double-layer barrier is composed of SiCO/AlN, and in FIG. 7B, a double-layer barrier is composed of SiCN/low k SiCO. In FIG. 5B, the three-layer barrier is composed of SiCN/AlN/low k SiCN and in FIG. 6B, the three-layer barrier is composed of SiCN/SiNx/low k SiCN.

The present disclosure relates to a self-aligned interconnection structure and manufacturing method thereof for selectively forming at least one barrier layer on the conductive feature but not on the dielectric layer.

According to some embodiments of the present disclosure, a self-aligned interconnection structure is provided, including a dielectric layer, a conductive feature, a capping layer, a first barrier layer and a second barrier layer. The conductive feature is disposed in the dielectric layer, and the conductive feature has a top surface. The capping layer is disposed on the top surface of the conductive feature, and the capping layer does not cover the dielectric layer. The first barrier layer is disposed on the capping layer, and the first barrier layer does not cover the dielectric layer. The second barrier layer covers the first barrier layer and the dielectric layer, wherein the first barrier layer and the second barrier layer are formed of different materials.

According to some embodiments of the present disclosure, a self-aligned interconnection structure is provided, including a dielectric layer, a conductive feature, a capping layer and a first barrier layer. The conductive feature is formed in the dielectric layer, and the conductive feature has a top surface. The capping layer is disposed on the top surface of the conductive feature, and the capping layer does not cover the dielectric layer. The first barrier layer is disposed on the capping layer, and the first barrier layer does not cover the dielectric layer. The first barrier layer comprises AlNx, AlOx, AlOxNy or a combination thereof.

According to some embodiments of the present disclosure, a method for manufacturing a self-aligned interconnection structure is proposed. A conductive feature is formed in a dielectric layer, and the conductive feature has a top surface. A capping layer is formed on the top surface of the conductive feature, and the capping layer does not cover the dielectric layer. A first barrier layer is formed on the capping layer, and the first barrier layer does not cover the dielectric layer. Before forming the first barrier layer on the capping layer, a pre-treatment process is performed on the surface of the dielectric layer to help selectively deposit the first barrier layer on the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a self-aligned interconnection structure, comprising:

forming a conductive feature in a dielectric layer, the conductive feature having a top surface;

forming a capping layer on the top surface of the conductive feature, and the capping layer does not cover the dielectric layer;

forming a first barrier layer on the capping layer, and the first barrier layer does not cover the dielectric layer; and forming a second barrier layer on the first barrier layer and the dielectric layer, wherein the first barrier layer and the second barrier layer are formed of different materials, wherein forming the second barrier layer comprises reacting a silicon-containing precursor with $NH_3$ plasma to form a nitrogen-doped silicon carbide film, wherein before forming the first barrier layer on the capping layer, a pre-treatment process is performed on a surface of the dielectric layer to help selectively deposit the first barrier layer on the capping layer.

2. The method for manufacturing a self-aligned interconnection structure according to claim 1, wherein the first barrier layer comprises AlNx, AlOx, AlOxNy or a combination thereof, and the first barrier layer is formed by a combination of Trimethylaluminum (TMA) and $NH_3$ plasma.

3. The method for manufacturing a self-aligned interconnection structure according to claim 1, wherein the first barrier layer is selectively formed on the capping layer without using a self-assembled monolayer (SAM) to form the self-aligned interconnection structure.

4. The method for manufacturing a self-aligned interconnection structure according to claim 1, wherein the first barrier layer and the second barrier layer are etch stop layers.

5. The method for manufacturing a self-aligned interconnection structure according to claim 1, wherein the first barrier layer is an adhesive layer or an anti-oxidation layer, and the second barrier layer is an etch stop layer or a hermetic layer.

6. The method for manufacturing a self-aligned interconnection structure according to claim 1, further comprising:

forming a third barrier layer and a fourth barrier layer on the second barrier layer, wherein the third barrier layer covers the second barrier layer, the fourth barrier layer covers the third barrier layer, and the first barrier layer and the third barrier layer are formed of a same material, and the second barrier layer and the fourth barrier layer are formed of a same material or different materials.

7. The method for manufacturing a self-aligned interconnection structure according to claim 6, wherein the first barrier layer comprises AlNx, AlOx, AlOxNy or a combination thereof, and the first barrier layer is formed by a combination of Trimethylaluminum (TMA) and $NH_3$ plasma.

8. The method for manufacturing a self-aligned interconnection structure according to claim 6, wherein the second barrier layer and the fourth barrier layer are made of silicon carbide doped with nitrogen or oxygen.

9. A method for manufacturing a self-aligned interconnection structure, comprising:

forming a conductive feature in a dielectric layer, the conductive feature having a top surface;

forming a capping layer on the top surface of the conductive feature, and the capping layer does not cover the dielectric layer; and forming a first barrier layer on the capping layer, and the first barrier layer does not cover the dielectric layer, wherein the first barrier layer comprises AlNx, AlOx, AlOxNy or a combination thereof, and forming a second barrier layer on the first barrier layer and the dielectric layer, wherein the first barrier layer and the second barrier layer are formed of different materials, wherein forming the second barrier layer comprises reacting a silicon-containing precursor with $NH_3$ plasma to form a nitrogen-doped silicon carbide film or an oxygen-doped silicon carbide film, wherein before forming the first barrier layer on the capping layer, a pre-treatment process is performed on a surface of the dielectric layer to help selectively deposit the first barrier layer on the capping layer.

10. The method for manufacturing a self-aligned interconnection structure according to claim 9, further comprising:

forming a third barrier layer and a fourth barrier layer on the second barrier layer, wherein the third barrier layer covers the second barrier layer, the fourth barrier layer covers the third barrier layer, and the first barrier layer and the third barrier layer are formed of a same material, and the second barrier layer and the fourth barrier layer are formed of a same material or different materials.

11. The method for manufacturing a self-aligned interconnection structure according to claim 10, wherein the first barrier layer and the third barrier layer is formed by a combination of Trimethylaluminum (TMA) and $NH_3$ plasma.

12. The method for manufacturing a self-aligned interconnection structure according to claim 10, wherein the second barrier layer and the fourth barrier layer are made of silicon carbide doped with nitrogen or oxygen.

13. A method for manufacturing a self-aligned interconnection structure, comprising:

forming a conductive feature in a dielectric layer, the conductive feature having a top surface;

forming a capping layer on the top surface of the conductive feature, and the capping layer does not cover the dielectric layer; and forming a first barrier layer on the capping layer, and the first barrier layer does not cover the dielectric layer, wherein the first barrier layer comprises AlNx, AlOx, AlOxNy or a combination thereof;

before forming the first barrier layer on the capping layer, a pre-treatment process is performed on a surface of the dielectric layer to help selectively deposit the first barrier layer on the capping layer without using a self-assembled monolayer (SAM), wherein the pre-treatment process is performed by generating $H_2$ plasma formed from a hydrogen-containing precursor, and the $H_2$ plasma changes the surface of the dielectric layer by reducing a number of unwanted hydroxyl groups on the surface of the dielectric layer and providing a chemical modification of the dielectric layer through surface hydrogenation.

14. The method for manufacturing a self-aligned interconnection structure according to claim 13, wherein the first barrier layer is formed by a combination of Trimethylaluminum (TMA) and $NH_3$ plasma.

15. The method for manufacturing a self-aligned interconnection structure according to claim 13, wherein the first barrier layer is a self-aligned barrier layer.

16. The method for manufacturing a self-aligned interconnection structure according to claim 13, wherein the first barrier layer is used as an adhesive layer or an etch stop layer.

* * * * *